(12) United States Patent  
Nakamura

(10) Patent No.: US 8,854,238 B2  
(45) Date of Patent: Oct. 7, 2014

(54) ASYNCHRONOUS SAMPLING FREQUENCY CONVERSION DEVICE, METHOD, AND COMPUTER PROGRAM PRODUCT

(71) Applicant: JVC KENWOOD Corporation, Yokohama (JP)

(72) Inventor: Masami Nakamura, Tokyo (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 0 days.

(21) Appl. No.: 13/750,217

(22) Filed: Jan. 25, 2013

(65) Prior Publication Data

US 2013/0194007 A1    Aug. 1, 2013

(30) Foreign Application Priority Data

Jan. 30, 2012  (JP) .................................. 2012-017362

(51) Int. Cl.
```
H03M 7/00      (2006.01)
H03H 17/06     (2006.01)
G11B 20/10     (2006.01)
H03B 28/00     (2006.01)
```
(52) U.S. Cl.
CPC ........... *H03B 28/00* (2013.01); *H03H 17/0628* (2013.01); *G11B 20/10527* (2013.01); *G11B 20/10231* (2013.01)
USPC ............................................. 341/61; 341/123

(58) Field of Classification Search
USPC .................................................. 341/61, 123
See application file for complete search history.

(56) References Cited

U.S. PATENT DOCUMENTS

| | | | | |
|---|---|---|---|---|
| 5,432,511 A * | 7/1995 | Sadjadian et al. | ............. | 341/61 |
| 5,617,088 A * | 4/1997 | Yasuda | ............................. | 341/61 |
| 7,408,485 B1 * | 8/2008 | Yu et al. | ........................... | 341/61 |
| 7,436,333 B2 * | 10/2008 | Forman et al. | .................... | 341/61 |
| 8,405,532 B1 * | 3/2013 | Clark et al. | ...................... | 341/61 |

FOREIGN PATENT DOCUMENTS

JP           64-077326         3/1989

* cited by examiner

*Primary Examiner* — Brian Young  
(74) *Attorney, Agent, or Firm* — Venable LLP; Michael A. Santori; F. Brock Riggs

(57) ABSTRACT

An asynchronous sampling frequency conversion device includes: a storage unit configured to store input digital signals; a data specifying unit configured to specify first data and second data based on a ratio of a sampling frequency of the input digital signal to a sampling frequency of an output digital signal, the first data being sampled at a sampling timing immediately before an $i^{th}$ (where i is a natural number) sampling timing of the output digital signal among the input digital signals stored in the storage unit, the second data being sampled at the sampling timing immediately after the $i^{th}$ sampling timing of the output digital signal; and an output data value calculator configured to calculate a value of $i^{th}$ data of the output digital signal based on the first data and the second data specified by the data specifying unit and the ratio.

6 Claims, 11 Drawing Sheets

FIG.2

INPUT SAMPLING DATA INFORMATION

| SAMPLING SEQUENCE (n) | TIME ($T_n = n/f_{in}$) | INPUT SAMPLING DATA ($X_n$) |
|---|---|---|
| 0 | 0.000000 | 0 |
| 1 | 0.000021 | 0.5 |
| 2 | 0.000042 | 0.866025404 |
| 3 | 0.000063 | 1 |
| 4 | 0.000083 | 0.866025404 |
| 5 | 0.000104 | 0.5 |
| 6 | 0.000125 | 0 |
| 7 | 0.000146 | -0.5 |
| 8 | 0.000167 | -0.866025404 |
| 9 | 0.000188 | -1 |
| 10 | 0.000208 | -0.866025404 |
| 11 | 0.000229 | -0.5 |
| 12 | 0.000250 | 0 |
| 13 | 0.000271 | 0.5 |
| 14 | 0.000292 | 0.866025404 |
| 15 | 0.000313 | 1 |
| 16 | 0.000333 | 0.866025404 |
| 17 | 0.000354 | 0.5 |
| 18 | 0.000375 | 0 |
| 19 | 0.000396 | -0.5 |
| 20 | 0.000417 | -0.866025404 |
| 21 | 0.000438 | -1 |
| 22 | 0.000458 | -0.866025404 |
| 23 | 0.000479 | -0.5 |
| 24 | 0.000500 | 0 |
| 25 | 0.000521 | 0.5 |
| 26 | 0.000542 | 0.866025404 |
| 27 | 0.000563 | 1 |
| 28 | 0.000583 | 0.866025404 |
| 29 | 0.000604 | 0.5 |
| 30 | 0.000625 | 0 |
| 31 | 0.000646 | -0.5 |
| 32 | 0.000667 | -0.866025404 |
| 33 | 0.000688 | -1 |
| 34 | 0.000708 | -0.866025404 |
| 35 | 0.000729 | -0.5 |
| 36 | 0.000750 | 0 |
| 37 | 0.000771 | 0.5 |
| 38 | 0.000792 | 0.866025404 |
| 39 | 0.000813 | 1 |
| 40 | 0.000833 | 0.866025404 |
| 41 | 0.000854 | 0.5 |
| 42 | 0.000875 | 0 |
| 43 | 0.000896 | -0.5 |
| 44 | 0.000917 | -0.866025404 |
| 45 | 0.000938 | -1 |
| 46 | 0.000958 | -0.866025404 |
| 47 | 0.000979 | -0.5 |
| 48 | 0.001000 | 0 |
| 49 | 0.001021 | 0.5 |
| 50 | 0.001042 | 0.866025404 |
| ... | ... | ... |
| 479 | 0.009979 | -0.5 |
| 480 | 0.010000 | 0 |

FIG.5

| SAMPLING SEQUENCE (i) | $i \cdot f_{in}/f_{out}$ | rounddown ($i \cdot f_{in}/f_{out}$)=n | roundup ($i \cdot f_{in}/f_{out}$) | Xn | Xn+1 |
|---|---|---|---|---|---|
| 0 | 0 | 0 | 0 | 0 | 0 |
| 1 | 1.088435374 | 1 | 2 | 0.5 | 0.866025404 |
| 2 | 2.176870748 | 2 | 3 | 0.866025404 | 1 |
| 3 | 3.265306122 | 3 | 4 | 1 | 0.866025404 |
| 4 | 4.353741497 | 4 | 5 | 0.866025404 | 0.5 |
| 5 | 5.442176871 | 5 | 6 | 0.5 | 0 |
| 6 | 6.530612245 | 6 | 7 | 0 | -0.5 |
| 7 | 7.619047619 | 7 | 8 | -0.5 | -0.866025404 |
| 8 | 8.707482993 | 8 | 9 | -0.866025404 | -1 |
| 9 | 9.795918367 | 9 | 10 | -1 | -0.866025404 |
| 10 | 10.88435374 | 10 | 11 | -0.866025404 | -0.5 |
| 11 | 11.97278912 | 11 | 12 | -0.5 | 0 |
| 12 | 13.06122449 | 13 | 14 | 0.5 | 0.866025404 |
| 13 | 14.14965986 | 14 | 15 | 0.866025404 | 1 |
| 14 | 15.23809524 | 15 | 16 | 1 | 0.866025404 |
| 15 | 16.32653061 | 16 | 17 | 0.866025404 | 0.5 |
| 16 | 17.41496599 | 17 | 18 | 0.5 | 0 |
| 17 | 18.50340136 | 18 | 19 | 0 | -0.5 |
| 18 | 19.59183673 | 19 | 20 | -0.5 | -0.866025404 |
| 19 | 20.68027211 | 20 | 21 | -0.866025404 | -1 |
| 20 | 21.76870748 | 21 | 22 | -1 | -0.866025404 |
| 21 | 22.85714286 | 22 | 23 | -0.866025404 | -0.5 |
| 22 | 23.94557823 | 23 | 24 | -0.5 | 0 |
| 23 | 25.03401361 | 25 | 26 | 0.5 | 0.866025404 |
| 24 | 26.12244898 | 26 | 27 | 0.866025404 | 1 |
| 25 | 27.21088435 | 27 | 28 | 1 | 0.866025404 |
| 26 | 28.29931973 | 28 | 29 | 0.866025404 | 0.5 |
| 27 | 29.3877551 | 29 | 30 | 0.5 | 0 |
| 28 | 30.47619048 | 30 | 31 | 0 | -0.5 |
| 29 | 31.56462585 | 31 | 32 | -0.5 | -0.866025404 |
| 30 | 32.65306122 | 32 | 33 | -0.866025404 | -1 |
| 31 | 33.7414966 | 33 | 34 | -1 | -0.866025404 |
| 32 | 34.82993197 | 34 | 35 | -0.866025404 | -0.5 |
| 33 | 35.91836735 | 35 | 36 | -0.5 | 0 |
| 34 | 37.00680272 | 37 | 38 | 0.5 | 0.866025404 |
| 35 | 38.0952381 | 38 | 39 | 0.866025404 | 1 |
| 36 | 39.18367347 | 39 | 40 | 1 | 0.866025404 |
| 37 | 40.27210884 | 40 | 41 | 0.866025404 | 0.5 |
| 38 | 41.36054422 | 41 | 42 | 0.5 | 0 |
| 39 | 42.44897959 | 42 | 43 | 0 | -0.5 |
| 40 | 43.53741497 | 43 | 44 | -0.5 | -0.866025404 |
| 41 | 44.62585034 | 44 | 45 | -0.866025404 | -1 |
| 42 | 45.71428571 | 45 | 46 | -1 | -0.866025404 |
| 43 | 46.80272109 | 46 | 47 | -0.866025404 | -0.5 |
| 44 | 47.89115646 | 47 | 48 | -0.5 | 0 |
| 45 | 48.97959184 | 48 | 49 | 0 | 0.5 |
| 46 | 50.06802721 | 50 | 51 | 0.866025404 | 1 |
| 47 | 51.15646259 | 51 | 52 | 1 | 0.866025404 |
| 48 | 53.24489796 | 52 | 53 | 0.866025404 | 0.5 |
| 49 | 53.33333333 | 53 | 54 | 0.5 | 0 |
| 50 | 54.42176871 | 54 | 55 | 0 | -0.5 |

FIG.6

| SAMPLING SEQUENCE (i) | TIME ($T_i = i/f_{out}$) | OUTPUT SAMPLING DATA ($Y_i$) |
|---|---|---|
| 0 | 0.000000 | 0 |
| 1 | 0.000023 | 0.53237 |
| 2 | 0.000045 | 0.889722 |
| 3 | 0.000068 | 0.964456 |
| 4 | 0.000091 | 0.726547 |
| 5 | 0.000113 | 0.278912 |
| 6 | 0.000136 | -0.26531 |
| 7 | 0.000159 | -0.72659 |
| 8 | 0.000181 | -0.96081 |
| 9 | 0.000204 | -0.89337 |
| 10 | 0.000227 | -0.54233 |
| 11 | 0.000249 | -0.01361 |
| 12 | 0.000272 | 0.52241 |
| 13 | 0.000295 | 0.866076 |
| 14 | 0.000317 | 0.968101 |
| 15 | 0.000340 | 0.746507 |
| 16 | 0.000363 | 0.292517 |
| 17 | 0.000385 | -0.2517 |
| 18 | 0.000408 | -0.71663 |
| 19 | 0.000431 | -0.95716 |
| 20 | 0.000454 | -0.89701 |
| 21 | 0.000476 | -0.55229 |
| 22 | 0.000499 | -0.02721 |
| 23 | 0.000522 | 0.51245 |
| 24 | 0.000544 | 0.88243 |
| 25 | 0.000567 | 0.971747 |
| 26 | 0.000590 | 0.756467 |
| 27 | 0.000612 | 0.306122 |
| 28 | 0.000635 | -0.2381 |
| 29 | 0.000658 | -0.70667 |
| 30 | 0.000680 | -0.95352 |
| 31 | 0.000703 | -0.90066 |
| 32 | 0.000726 | -0.56225 |
| 33 | 0.000748 | -0.04082 |
| 34 | 0.000771 | 0.50249 |
| 35 | 0.000794 | 0.878785 |
| 36 | 0.000816 | 0.975392 |
| 37 | 0.000839 | 0.766427 |
| 38 | 0.000862 | 0.319728 |
| 39 | 0.000884 | -0.22449 |
| 40 | 0.000907 | -0.69671 |
| 41 | 0.000930 | -0.94987 |
| 42 | 0.000952 | -0.9043 |
| 43 | 0.000975 | -0.57221 |
| 44 | 0.000998 | -0.05442 |
| 45 | 0.001020 | 0.489796 |
| 46 | 0.001043 | 0.875139 |
| 47 | 0.001066 | 0.979038 |
| 48 | 0.001088 | 0.776387 |
| 49 | 0.001111 | 0.333333 |
| 50 | 0.001134 | -0.21088 |

FIG.9

| SAMPLING SEQUENCE (i) | TIME (Ti=i/$f_{out}$) | OUTPUT SAMPLING DATA (Zi) |
|---|---|---|
| 0 | 0.000000 | 0 |
| 1 | 0.000023 | 0.571342 |
| 2 | 0.000045 | 0.913562 |
| 3 | 0.000068 | 0.990298 |
| 4 | 0.000091 | 0.790466 |
| 5 | 0.000113 | 0.306803 |
| 6 | 0.000136 | -0.29184 |
| 7 | 0.000159 | -0.77978 |
| 8 | 0.000181 | -0.98655 |
| 9 | 0.000204 | -0.9173 |
| 10 | 0.000227 | -0.58203 |
| 11 | 0.000249 | -0.01497 |
| 12 | 0.000272 | 0.560653 |
| 13 | 0.000295 | 0.909818 |
| 14 | 0.000317 | 0.994041 |
| 15 | 0.000340 | 0.801155 |
| 16 | 0.000363 | 0.321769 |
| 17 | 0.000385 | -0.27687 |
| 18 | 0.000408 | -0.76909 |
| 19 | 0.000431 | -0.98281 |
| 20 | 0.000454 | -0.92105 |
| 21 | 0.000476 | -0.59272 |
| 22 | 0.000499 | -0.02993 |
| 23 | 0.000522 | 0.549964 |
| 24 | 0.000544 | 0.906075 |
| 25 | 0.000567 | 0.997785 |
| 26 | 0.000590 | 0.811844 |
| 27 | 0.000612 | 0.336735 |
| 28 | 0.000635 | -0.2619 |
| 29 | 0.000658 | -0.7584 |
| 30 | 0.000680 | -0.97907 |
| 31 | 0.000703 | -0.92479 |
| 32 | 0.000726 | -0.60341 |
| 33 | 0.000748 | -0.0449 |
| 34 | 0.000771 | 0.539275 |
| 35 | 0.000794 | 0.902332 |
| 36 | 0.000816 | 1.001528 |
| 37 | 0.000839 | 0.822533 |
| 38 | 0.000862 | 0.351701 |
| 39 | 0.000884 | -0.24694 |
| 40 | 0.000907 | -0.74771 |
| 41 | 0.000930 | -0.97533 |
| 42 | 0.000952 | -0.92853 |
| 43 | 0.000975 | -0.6141 |
| 44 | 0.000998 | -0.05986 |
| 45 | 0.001020 | 0.538776 |
| 46 | 0.001043 | 0.898589 |
| 47 | 0.001066 | 1.005271 |
| 48 | 0.001088 | 0.833222 |
| 49 | 0.001111 | 0.366667 |
| 50 | 0.001134 | -0.23197 |

FIG.11

OUTPUT SAMPLING DATA INFORMATION

| SAMPLING SEQUENCE (i) | i·f_in/f_out | rounddown (i·f_in/f_out)=n |
|---|---|---|
| 0 | 0 | 0 |
| 1 | 1.088435374 | 1 |
| 2 | 2.176870748 | 2 |
| 3 | 3.265306122 | 3 |
| 4 | 4.353741497 | 4 |
| 5 | 5.442176871 | 5 |
| 6 | 6.530612245 | 6 |
| 7 | 7.619047619 | 7 |
| 8 | 8.707482993 | 8 |
| 9 | 9.795918367 | 9 |
| 10 | 10.88435374 | 10 |
| 11 | 11.97278912 | 11 |
| 12 | 13.06122449 | 13 |
| 13 | 14.14965986 | 14 |
| 14 | 15.23809524 | 15 |
| 15 | 16.32653061 | 16 |
| 16 | 17.41496599 | 17 |
| 17 | 18.50340136 | 18 |
| 18 | 19.59183673 | 19 |
| 19 | 20.68027211 | 20 |
| 20 | 21.76870748 | 21 |
| 21 | 22.85714286 | 22 |
| 22 | 23.94557823 | 23 |
| 23 | 25.03401361 | 25 |
| 24 | 26.12244898 | 26 |
| 25 | 27.21088435 | 27 |
| 26 | 28.29931973 | 28 |
| 27 | 29.3877551 | 29 |
| 28 | 30.47619048 | 30 |
| 29 | 31.56462585 | 31 |
| 30 | 32.65306122 | 32 |
| 31 | 33.7414966 | 33 |
| 32 | 34.82993197 | 34 |
| 33 | 35.91836735 | 35 |
| 34 | 37.00680272 | 37 |
| 35 | 38.0952381 | 38 |
| 36 | 39.18367347 | 39 |
| 37 | 40.27210884 | 40 |
| 38 | 41.36054422 | 41 |
| 39 | 42.44897959 | 42 |
| 40 | 43.53741497 | 43 |
| 41 | 44.62585034 | 44 |
| 42 | 45.71428571 | 45 |
| 43 | 46.80272109 | 46 |
| 44 | 47.89115646 | 47 |
| 45 | 48.97959184 | 48 |
| 46 | 50.06802721 | 50 |
| 47 | 51.15646259 | 51 |
| 48 | 52.24489796 | 52 |
| 49 | 53.33333333 | 53 |
| 50 | 54.42176871 | 54 |
| ... | ... | ... |
| ... | ... | ... |
| ... | ... | ... |
| ... | ... | ... |

ASYNCHRONOUS SAMPLING FREQUENCY CONVERSION DEVICE, METHOD, AND COMPUTER PROGRAM PRODUCT

CROSS-REFERENCE TO RELATED APPLICATIONS

The present application claims priority to and incorporates by reference the entire contents of Japanese Patent Application No. 2012-017362 filed in Japan on Jan. 30, 2012.

BACKGROUND

The present invention relates to an asynchronous sampling frequency conversion device, a method, and a computer program product.

When an analog signal is converted into a digital signal, a sampling method of reading the waveform level of the analog signal at given time intervals and recording the read level value is used. In digital audio devices or the like, 32 kHz, 44.1 kHz, 48 kHz, and 96 kHz are generally used as sampling frequencies. For example, in cases of a CD (compact disc) and a DVD (digital versatile disc), sampling is performed at 44.1 kHz and 48 kHz, respectively.

For example, when a digital signal is transmitted and received between devices in which sampling frequencies are different, it is necessary to convert the sampling frequency of the digital signal. In order to change the sampling frequency of a digital signal, an asynchronous sampling rate converter is used.

A conventional asynchronous sampling rate converter changes a sampling frequency by performing up-sampling (0 compensation) on an input signal up to the least common multiple between sample frequencies before and after conversion, and then performing down-sampling (thinning) to a desired sampling frequency. Accordingly, for example, when the conventional asynchronous sampling rate converter converts a sampling frequency from 48 kHz to 44.1 kHz, the conventional asynchronous sampling rate converter has to perform up-sampling up to 7056 kHz which is the least common multiple between 48 kHz and 44.1 kHz, that is, up-sampling by 147 multiples of the input signal.

In the conventional asynchronous sampling rate converter, a LPF (Lowpass Filter) that cuts a high-frequency component equal to or greater than the nyquist frequency (½ of the sampling frequency of an input signal) is disposed between an up-sampling unit and a down-sampling unit. An input signal into the LPF is a signal subjected to the up-sampling, and the sampling frequency of the signal is very high, as described above. For this reason, the LPF is required to have high-speed responsiveness and a high processing performance.

As a technology for suppressing a processing amount in an asynchronous sampling converter, a method of using linear interpolation is suggested by Japanese Laid-open Patent Publication No. 1-77326.

According to the method of using linear interpolation disclosed in Japanese Laid-open Patent Publication No. 1-77326, sample data Yi (where i is a natural number) after conversion is calculated from two pieces of sampling data Xn and Xn+1 (where n is a natural number) before conversion sampled at timings immediately before and after the sampling timing of Yi. Specifically, Yi is calculated by a calculation expression "Yi=(1−ki)·Xn+ki·Xn+1" using ki as an interpolation coefficient corresponding to Yi.

The interpolation coefficient ki is calculated by "ki=(i·θ2−n·θ1)/θ1" by first specifying n that satisfies "n·θ1≤i·θ2<(n+1)·θ1" for each i, when it is assumed that θ1 is an input sampling period and θ2 is an output sampling period. Thus, in the method of using the linear interpolation disclosed in Japanese Laid-open Patent Publication No. 1-77326, it is necessary to first specify "n" and calculate each interpolation coefficient ki using the specified "n" in order to calculate each sampling data Yi after conversion. For this reason, it takes much time to perform the calculation, since a calculation amount is large.

According to the sampling theorem, an input signal with a frequency band up to ½ of an input clock frequency $f_{in}(=1/\theta 1)$ can be reproduced. However, due to the frequency characteristics of the linear interpolation, the amplitude of a waveform reproduced from the output sampling data Yi calculated through the linear interpolation decreases, as the frequency band of an input signal increases. Therefore, waveform distortion may be worsened. For example, with regard to an input signal with a frequency band of ½ of an input clock frequency $f_{in}$, the amplitude of a waveform formed by the output sampling data Yi may decrease about 0.64 times the amplitude of the input signal.

SUMMARY

According to an aspect of the present invention, an asynchronous sampling frequency conversion device includes: a storage unit configured to store input digital signals; a data specifying unit configured to specify first data and second data based on a ratio of a sampling frequency of the input digital signal to a sampling frequency of an output digital signal, the first data being sampled at a sampling timing immediately before an $i^{th}$ (where i is a natural number) sampling timing of the output digital signal among the input digital signals stored in the storage unit, the second data being sampled at the sampling timing immediately after the $i^{th}$ sampling timing of the output digital signal; and an output data value calculator configured to calculate a value of $i^{th}$ data of the output digital signal based on the first data and the second data specified by the data specifying unit and the ratio.

BRIEF DESCRIPTION OF THE DRAWINGS

FIG. 2 is a diagram illustrating an example of input sampling data information of an L channel according to the first embodiment;

FIG. 5 is a diagram illustrating a correspondence relation among a sequence i of output sampling, a product $(i \cdot f_{in}/f_{OUT})$ of the sequence i and a ratio $f_{in}/f_{OUT}$, a rounddown $(i \cdot f_{in}/f_{OUT})$ a roundup $(i \cdot f_{in}/f_{OUT})$ input sampling data Xn, and input sampling data Xn+1, when a process of converting a sine wave with 8 kHz is performed according to the first embodiment;

FIG. 6 is a diagram illustrating a list of the output sampling data of the L channel according to the first embodiment;

FIG. 9 is a diagram illustrating a list of the output sampling data of an L channel according to the second embodiment;

FIG. 11 is a diagram illustrating an example of output sampling information of the L channel.

DETAILED DESCRIPTION

An asynchronous sampling frequency conversion device according to preferred embodiments of the invention will be described.

First Embodiment

Figure 1:
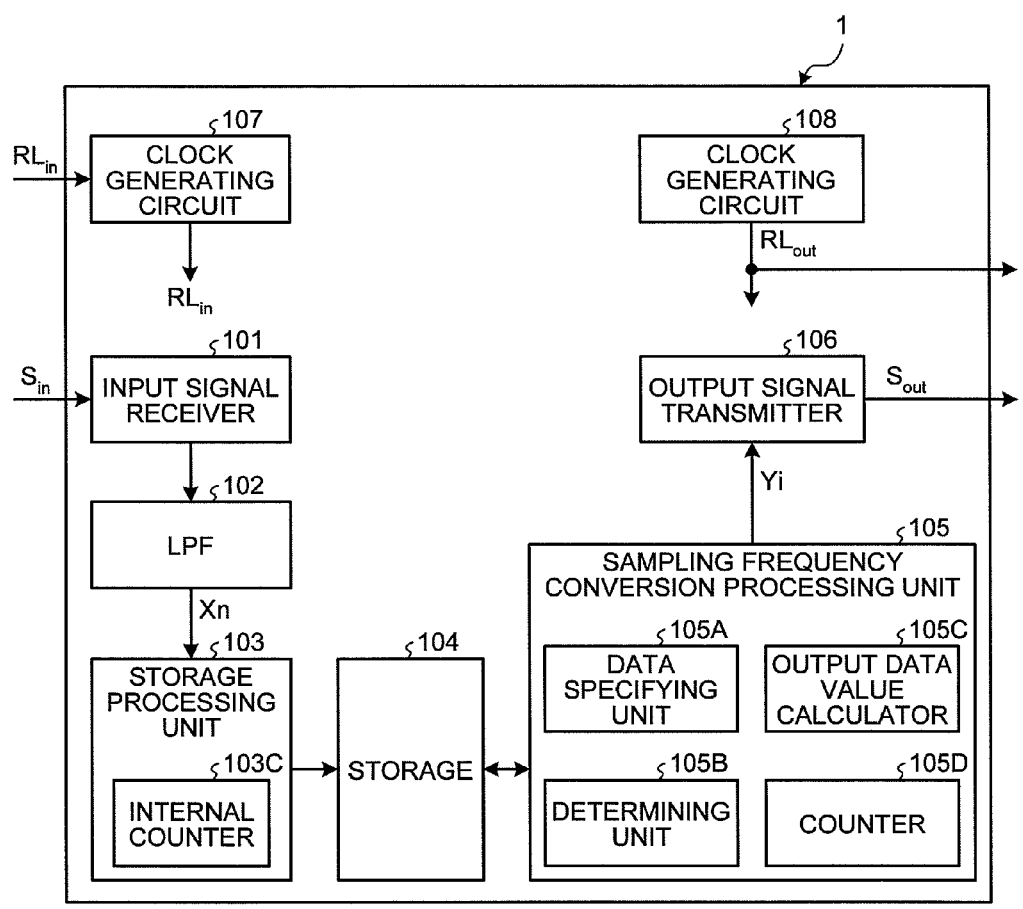
FIG. 1 is a block diagram illustrating an example of an asynchronous sampling frequency conversion device according to a first embodiment.

An asynchronous sampling frequency conversion device 1 according to a first embodiment is a device that converts the sampling frequency of an input digital signal and outputs the converted sampling frequency. As illustrated in FIG. 1, the asynchronous sampling frequency conversion device 1 includes an input signal receiver 101, an LPF 102, a storage processing unit 103, a storage (a storage unit) 104, a sampling frequency conversion processing unit 105, an output signal transmitter 106, and clock generating circuits 107 and 108.

For example, the input signal receiver 101 receives (latches) an input digital signal $S_{in}$ corresponding to two channels of an L channel and an R channel sent with I2S (The IC Sound Bus) which is a communication standard of a digital sound signal, left justified 24 bits, or the like in response to an RL clock $RL_{in}$ supplied from the clock generating circuit 107, and outputs the input digital signal $S_{in}$ to the LPF 102. For example, the RL clock $RL_{in}$ is generated from an RL clock transmitted from a signal supply source and has the same frequency as that of a sampling frequency (hereinafter, referred to as an input sampling frequency) $f_{in}$ of the input digital signal $S_{in}$. When the input sampling frequency $f_{in}$ is, for example, 48 kHz, the input signal receiver 101 receives two pieces of input sampling data of the L channel and the R channel for each about 20.8 μsec (=1/48 kHz).

The LPF (Lowpass Filter) unit 102 operates in response to the RL clock $RL_{in}$ supplied from the clock generating circuit 107 and limits the bandwidth of the input digital signal $S_{in}$. More specifically, the LPF 102 removes waveform distortion caused due to a return phenomenon by cutting a high-frequency wave component equal to or greater than the nyquist frequency (½ of input sampling frequency $f_{in}=f_{in}/2$) of the input signal $S_{in}$.

The storage processing unit 103 includes a CPU and a memory that stores an operation program of the CPU. The storage processing unit 103 includes an internal counter 103C with an initial setting value of "0." The CPU included in the storage processing unit 103 executes the operation program, counts a number (sequence) n of data (input sampling data) X output from the LPF 102 by counting up the internal counter 103C in response to the RL clock signal $RL_{in}$, and calculates a time Tn from sampling start to an $n^{th}$ sampling timing, that is, $n/f_{in}$. The storage processing unit 103 forms input data by causing the sequence n, the elapsed time Tn ($=n/f_{in}$), and the $n^{th}$ input sampling data Xn to correspond to each other, and stores a predetermined number of input data in the storage 104. When the predetermined number of input data are stored in the storage 104, the storage processing unit 103 erases the oldest (where the sequence n is the newest) input data and stores new input data. Further, data stored in the storage 104 is referred below to as input sampling data information.

For example, when the input digital signal $S_{in}$ is assumed to be data obtained by sampling an analog sine wave sin (2π·8000·t) with 8 kHz using the sampling frequency $f_{in}$ with 48 kHz, the storage processing unit 103 sequentially stores the sequence n, the elapsed time Tn ($=n/f_{in}$), and the input sampling data Xn in the storage 104, as illustrated in FIG. 2.

The storage 104 includes a RAM (Random Access Memory) and stores up to the predetermined number of input data in which the sequence n, the elapsed time Tn ($=n/f_{in}$), and the $n^{th}$ input sampling data Xn generated by the storage processing unit 103 correspond to each other. The storage 104 has a capacity in which a predetermined number of input data necessary for the sampling frequency conversion process performed by the sampling frequency conversion processing unit 105 can be stored. When the input sampling frequency is 48 kHz, for example, the storage 104 stores 480 pieces of input data of each of the L channel and the R channel. The number of input data retained in the storage 104 is merely an example. For example, the storage 104 may be configured to store 960 pieces of input data which is a double of the 480 pieces of input data.

The sampling frequency conversion processing unit 105 includes a CPU and an internal memory. The internal memory functions as a work area of a CPU (Central Processing Unit) and stores a conversion processing program executed by the CPU and fixed data necessary for the conversion process. The CPU functions as a data specifying unit 105A, a determining unit 105B, an output data value calculator 105C, and a counter 105D by executing the conversion processing program and calculates output sampling data of an output sampling frequency $f_{out}$ using the input sampling data information stored in the storage 104 by performing a conversion process to be described below.

The data specifying unit 105A specifies input sampling data sampled at timings immediately before and after the sampling timing of output sampling data Yi (where i is an output sequence and is a natural number). Here, "the timings immediately before and after the output sampling timing" does not mean physical timings, but means sampling timings of the input digital signal $S_{in}$ immediately before and after the output sampling timing by specifying a timing of the input digital signal $S_{in}$ corresponding to the output sampling timing in consideration of delay of signal processing and using the specified timing as a reference.

Specifically, the data specifying unit 105A acquires a ratio $f_{in}/f_{out}$ of the input sampling frequency $f_{in}$ to the output sampling frequency $f_{out}$. For example, when the data specifying unit 105A calculates the $i^{th}$ output sampling data Yi of the output digital signal, the data specifying unit 105A calculates a value roundup ($i \cdot f_{in}/f_{out}$) obtained by rounding up a value ($i \cdot f_{in}/f_{out}$) which is i times the acquired ratio $f_{in}/f_{out}$, to a natural number and a value rounddown ($i \cdot f_{in}/f_{out}$) obtained by rounding down a value ($i \cdot f_{in}/f_{out}$), which is i times the acquired ratio $f_{in}/f_{out}$, to a natural number. For example, when $i \cdot f_{in}/f_{out}=1.12$, the roundup ($i \cdot f_{in}/f_{out}$)=2 and the rounddown ($i \cdot f_{in}/f_{out}$)=1.

When the rounddown ($i \cdot f_{in}/f_{out}$)=n (natural number) the data specifying unit 105A specifies an $n^{th}$ input sampling data Xn as the input data sampled at timings immediately before the sampling timing of the output sampling data Yi, and specifies an $(n+1)^{th}$ input sampling data Xn+1 as the input data sampled at timings immediately after the sampling timing of the output sampling data Yi.

Here, when the rounddown $(i \cdot f_{in}/f_{out})$=the roundup $(i \cdot f_{in}/f_{out})$=n, that is, a value $(i \cdot f_{in}/f_{out})$ which is times the ratio $f_{in}/f_{out}$ is a natural number, the data specifying unit 105A specifies only the input sampling data Xn sampled at the same timing as the sampling timing of the output sampling data Yi as the data sampled at the timings immediately before and after the sampling timing of the output sampling data Yi.

The determining unit 105B determines whether the rounddown $(i \cdot f_{in}/f_{out})$=the roundup $(i \cdot f_{in}/f_{out})$=n. That is, the determining unit 105B determines whether a value $(i \cdot f_{in}/f_{out})$ which is i times the ratio $f_{in}/f_{out}$ is a natural number. Further, the determining unit 105B determines whether there are input sampling data corresponding to the rounddown $(i \cdot f_{in}/f_{out})$ and the roundup $(i \cdot f_{in}/f_{out})$ calculated by the data specifying unit 105A. Specifically, the determining unit 105B determines whether there are the sampling sequences corresponding to the rounddown $(i \cdot f_{in}/f_{out})$ and the roundup $(i \cdot f_{in}/f_{out})$ by searching for a column of the sampling sequence of the input sampling data information stored in the storage 104.

The output data value calculator 105C calculates the output sampling data Yi using the input sampling data Xn and Xn+1 specified by the data specifying unit 105A. Specifically, the output data value calculator 105C weights the input sampling data Xn with respect to a value obtained by subtracting the $(i \cdot f_{in}/f_{out})$ from the roundup $(i \cdot f_{in}/f_{out})$ and weights the input sampling data Xn+1 with respect to a value obtained by subtracting the rounddown $(i \cdot f_{in}/f_{out})$ from $(i \cdot f_{in}/f_{out})$. Then, the output data value calculator 105C calculates the sum of the weighted input sampling data as the $i^{th}$ output sampling data Yi of the output digital signal. That is, the output data value calculator 105C calculates the output sampling data Yi by the following expression (1).

$$Yi = Xn \cdot \{\text{roundup}(i \cdot f_{in}/f_{out}) - (i \cdot f_{in}/f_{out})\} + Xn+1 \cdot \{(i \cdot f_{in}/f_{out}) - \text{rounddown}(i \cdot f_{in}/f_{out})\} \quad (1)$$

In this expression, $\{(i \cdot f_{in}/f_{out}) - \text{rounddown}(i \cdot f_{in}/f_{out})\}$ corresponds to an interpolation coefficient ki in linear interpolation and $\{\text{roundup}(i \cdot f_{in}/f_{out}) - (i \cdot f_{in}/f_{out})\}$ corresponds to (1−ki).

Here, the determining unit 105B determines that the product $(i \cdot f_{in}/f_{out})$ is a natural number, that is, the rounddown $(i \cdot f_{in}/f_{out})$=the roundup $(i \cdot f_{in}/f_{out})$=n, the output data value calculator 105C calculates the input sampling data Xn specified by the data specifying unit 105A as the output sampling data Yi. Then, the sampling frequency conversion processing unit 105 outputs the output sampling data Yi calculated by the output data value calculator 105C to the output signal transmitter 106.

The counter 105D increments a counter value, whenever the output data value calculator 105C calculates the output sampling data Yi. The initial setting value of the counter value of the counter 105D is "1." The counter value of the counter 105D indicates a sampling sequence i in the output sampling frequency. The data specifying unit 105A specifies the input sampling data Xn and Xn+1 based on the product $(i \cdot f_{in}/f_{out})$ of the counter value i of the counter 105D and the ratio $f_{in}/f_{out}$.

The output signal transmitter 106 includes an FIFO memory. The output signal transmitter 106 stores the output sampling data Yi supplied from the sampling frequency conversion processing unit 105 and sequentially outputs the output sampling data Yi as the output digital signal $S_{out}$ in synchronization with the RL clock $RL_{out}$ of the output digital signal $S_{out}$ supplied from the clock generating circuit 108.

The clock generating circuit 107 supplies the RL clock $RL_{in}$ synchronized with the RL clock $RL_{in}$ supplied from a source supplying the input digital signal $S_{in}$ to the input signal receiver 101, the LPF 102, and the storage processing unit 103.

The clock generating circuit 108 generates and outputs the RL clock $RL_{out}$ of the output digital signal $S_{out}$. The RL clock $RL_{out}$ has the same frequency as the sampling frequency $f_{out}$ of the output digital signal $S_{out}$.

Next, a sampling frequency conversion process of the asynchronous sampling frequency conversion device 1 having the above-described configuration will be described.

Further, in the sampling frequency conversion process, a process on the data of the L channel and a process on the data of the R channel process are performed in parallel. However, the process for the L channel will be described below, since the process for the L channel is the same as the process of the R channel.

The sampling frequency conversion process includes a process of receiving the input digital signal $S_{in}$ and storing the input sampling data information in the storage 104 and a process of generating the output digital signal $S_{out}$ using the input sampling data information stored in the storage 104.

First, the process of receiving the input digital signal $S_{in}$ and then storing the input sampling data information in the storage processing unit 103 will be described with reference to FIG. 3.

The input sampling data (signal pieces) forming the input digital signal $S_{in}$ are sequentially supplied to the input signal receiver 101. The input signal receiver 101 sequentially receives (latches) the supplied input sampling data (signal pieces) in response to the RL clock $RL_{in}$ and sequentially supplies the input sampling data to the LPF 102.

The LPF 102 operates in response to the RL clock $RL_{in}$, filters the input sampling data supplied from the input signal receiver 101 by removing a high-frequency wave component from the input sampling data, and supplies the result to the storage processing unit 103.

Figure 3:
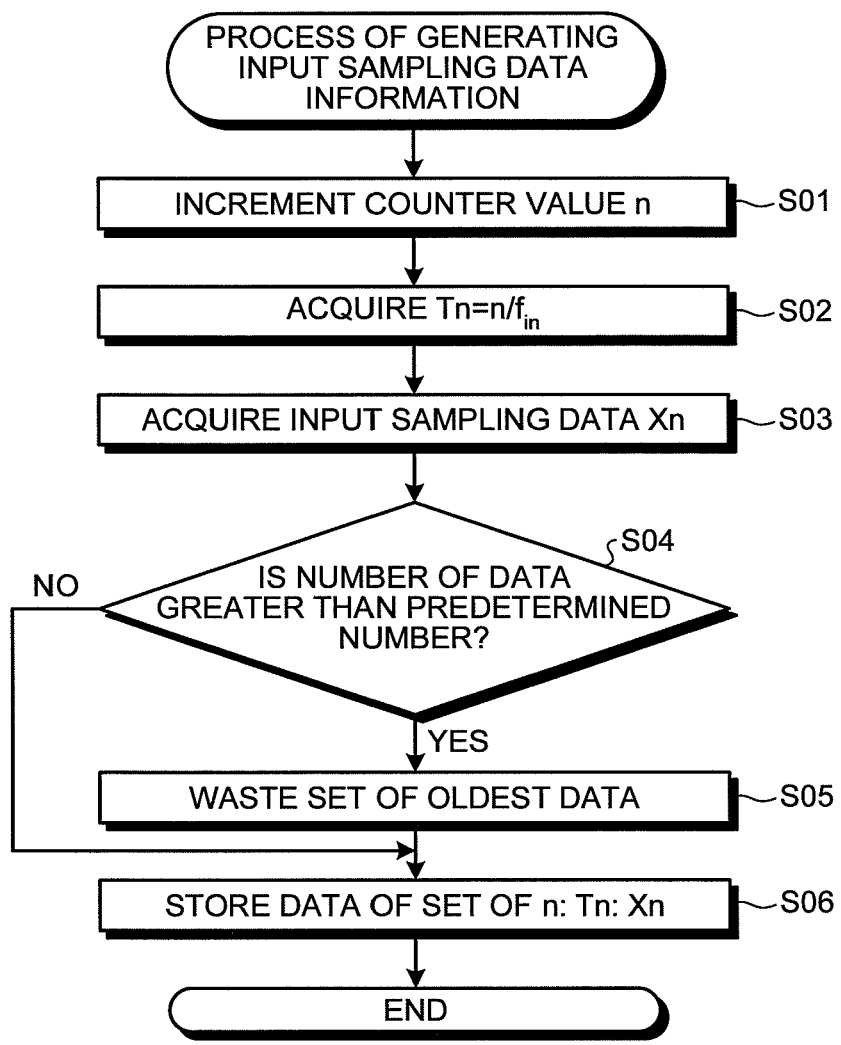
FIG. 3 is a flowchart illustrating a process of generating the input sampling data information of the L channel according to the first embodiment.

The storage processing unit 103 starts a process of generating the input sampling data information illustrated in FIG. 3 in response to the RL clock $RL_{in}$ supplied from the clock generating circuit 107.

First, the storage processing unit 103 (accurately, the CPU of the storage processing unit 103) increments the counter value (sequence) n of the internal counter 103C (step S01) and calculates the sequence n of the input sampling data.

Next, the storage processing unit 103 calculates the elapsed time Tn $(=n/f_{in})$ from the sampling start to an $n^{th}$ sampling timing by calculating a product of the counter value (sequence) n and a supply period $1/f_{in}$ of the input digital signal $S_{in}$ (step S02).

Next, the storage processing unit 103 acquires the input sampling data Xn output at the $n^{th}$ time from the LPF 102 (step S03) and determines whether the number of acquired input sampling data Xn is greater than a predetermined number (step S04).

When the storage processing unit 103 determines that the number of acquired input sampling data Xn is greater than the predetermined number (YES in step S04), the storage processing unit 103 wastes the oldest stored input data among the input sampling data information stored in the storage 104 from the input sampling data information (step S05). Then, the storage processing unit 103 adds input data formed by the counter value (sequence) n of the internal counter 103C incremented in the process of step S01, the elapsed time Tn calculated in the process of step S02, and the input sampling data Xn acquired in the process of step S03 to the input sampling data information (step S06).

Conversely, when the storage processing unit 103 determines that the number of acquired input sampling data Xn is not greater than the predetermined number (NO in step S04), the process of step S05 is skipped, and then the storage processing unit 103 adds input data formed by the counter value (sequence) n of the internal counter 103C incremented in the process of step S01, the elapsed time Tn calculated in the process of step S02, and the input sampling data Xn acquired in the process of step S03 to the input sampling data information (step S06).

By repeating the above-described process of generating the input sampling data information, as illustrated in FIG. 2, a predetermined number of input sampling data X immediately adjacent to each other are stored as the input sampling data information in the storage 104.

Next, a conversion process performed by the sampling frequency conversion processing unit 105 will be described with reference to FIG. 4. The sampling frequency conversion processing unit 105 performs conversion process for the L channel and the R channel in parallel. The conversion process for the L channel will be described below, since the conversion process for the L channel is the same as the conversion process for the R channel. The conversion process starts using $RL_{out}$ as a trigger.

It is supposed that the ratio $f_{in}/f_{out}$ of the input sampling frequency $f_{in}$ to the output sampling frequency $f_{out}$ is calculated in advance and is stored in a non-volatile memory or the like included in the internal memory of the sampling frequency conversion processing unit 105.

The data specifying unit 105A acquires the ratio $f_{in}/f_{out}$ of the input sampling frequency $f_{in}$ to the output sampling frequency $f_{out}$ stored in the internal memory of the sampling frequency conversion processing unit 105 (step 001). Then, the data specifying unit 105A acquires the counter value i from the counter 105D (step 002), and then calculates the product $(i \cdot f_{in}/f_{out})$ of the ratio $f_{in}/f_{out}$ acquired in step 001 and the counter value i (step 003). Then, the data specifying unit 105A calculates the rounddown $(i \cdot f_{in}/f_{out})$ obtained by rounding down the value $(i \cdot f_{in}/f_{out})$ calculated in step 003 and the roundup $(i \cdot f_{in}/f_{out})$ obtained by rounding up the value $(i \cdot f_{in}/f_{out})$ (step 004).

Then, the determining unit 105B determines whether the value n of the rounddown $(i \cdot f_{in}/f_{out})$ is the same as the value n of the roundup $(i \cdot f_{in}/f_{out})$ by comparing the rounddown $(i \cdot f_{in}/f_{out})$ to the roundup $(i \cdot f_{in}/f_{out})$. That is, the determining unit 105B determines whether the product $(i \cdot f_{in}/f_{out})$ calculated in step 003 is a natural number (step 005). When the determining unit 105B determines that the product $(i \cdot f_{in}/f_{out})$ is a natural number (YES in step 005), the determining unit 105B searches for the column of the sampling sequence of the input sampling data information stored in the storage 104 and determines whether there is the $n^{th}$ input sampling data Xn corresponding to the value of n of the rounddown $(i \cdot f_{in}/f_{out})$ calculated in step 004 (step 021).

When the determining unit 105B determines that there is the $n^{th}$ input sampling data Xn corresponding to the value of n of the rounddown $(i \cdot f_{in}/f_{out})$ calculated in step 004 (YES in step 021), the data specifying unit 105A specifies this input sampling data Xn as the data sampled at the timings immediately before and after the sampling timing of the output sampling data Yi (step 022). Then, the output data value calculator 105C calculates the input sampling data Xn specified by the data specifying unit 105A as the output sampling data Yi and the sampling frequency conversion processing unit 105 outputs the output sampling data Yi (input sampling data Xn) calculated by the output data value calculator 105C to the output signal transmitter 106 (step 023). Then, the process proceeds to step 009.

Conversely, when the determining unit 105B determines that there is no $n^{th}$ input sampling data Xn (NO in step 021), the sampling frequency conversion processing unit 105 initializes the counter value of the counter 105D (step 041) and ends the conversion process.

Conversely, when the determining unit 105B determines that the product $(i \cdot f_{in}/f_{out})$ is not a natural number (NO in step 005), the determining unit 105B searches for the column of the sampling sequence of the input sampling data information stored in the storage 104 and determines whether there are both the $n^{th}$ input sampling data Xn corresponding to the value n of the rounddown $(i \cdot f_{in}/f_{out})$ calculated in step 004 and the $(n+1)^{th}$ input sampling data Xn+1 (step 006). When the determining unit 105B determines that there is at least no input sampling data Xn+1 (NO in step 006), the process proceeds to step 041. Then, the sampling frequency conversion processing unit 105 initializes the counter value of the counter 105D, deletes the input sampling data information stored in the storage 104 (step 041), and ends the conversion process.

Conversely, when the determining unit 105B determines there are both the input sampling data Xn and the input sampling data Xn+1 (YES in step 006), the data specifying unit 105A specifies the input sampling data Xn and Xn+1 (step 007). Then, the output data value calculator 105C calculates the output sampling data Yi by the calculation expression (Expression (1)) of the above-described output sampling data Yi using the input sampling data Xn and Xn+1 specified by the data specifying unit 105A and the sampling frequency conversion processing unit 105 outputs the output sampling data Yi calculated by the output data value calculator 105C to the output signal transmitter 106 (step 008). Then, the sampling frequency conversion processing unit 105 increments the counter value of the counter 105D (step 009) and returns to step 001 to repeat the above-described processes.

Figure 4:
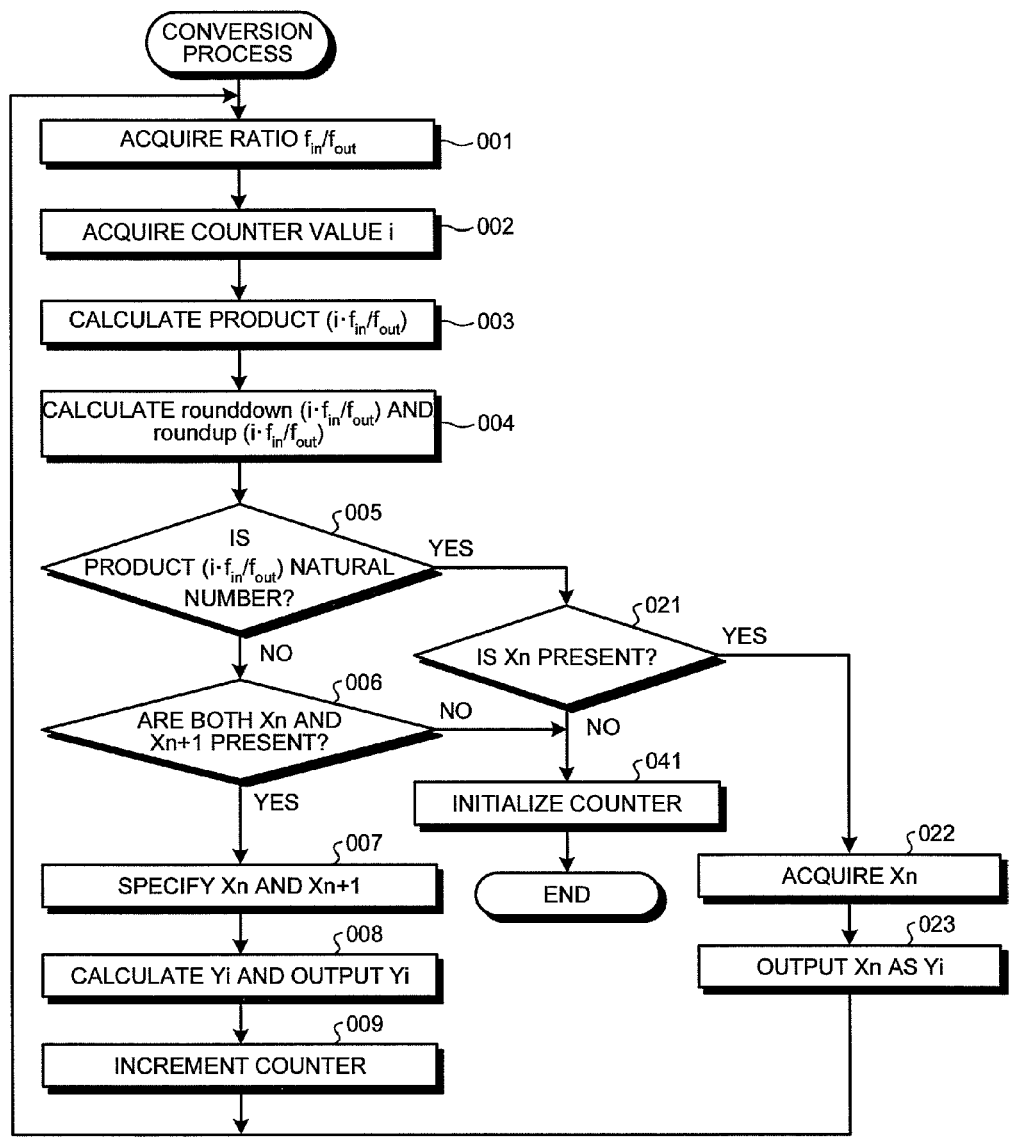
FIG. 4 is a flowchart illustrating an L channel conversion process according to the first embodiment.

Referring to FIGS. 2, 4, and 5, the process of each unit will be described using 48 kHz and 44.1 kHz as the input sampling frequency $f_{in}$ and the output sampling frequency $f_{out}$ and giving examples of specific numerical values. As in FIG. 2, FIG. 5 is a diagram illustrating a correspondence relation among the sampling sequence i at an output sampling frequency, the product $(i \cdot f_{in}/f_{out})$ of the sequence i and the ratio $f_{in}/f_{out}$, the rounddown $(i \cdot f_{in}/f_{out})$ the roundup $(i \cdot f_{in}/f_{out})$ and the input sampling data Xn and Xn+1 in the case in which the rounddown $(i \cdot f_{in}/f_{out})$ and the roundup $(i \cdot f_{in}/f_{out})$ are equal to n, when the conversion process according to this embodiment is performed on a sine wave $\sin(2\pi \cdot 8000 \cdot t)$ with 8 kHz.

The data specifying unit 105A acquires the ratio $f_{in}/f_{out}$ stored in the internal memory of the sampling frequency conversion processing unit 105 and the counter value i of the counter 105D (steps 001 and 002). Then, the data specifying unit 105A calculates a product of the ratio $f_{in}/f_{out}$ and the counter value i (step 003).

For example, when the counter value i is "1" and $i \cdot f_{in}/f_{out} = 1 \times (48 \div 44.1) = 1.088435374$, the data specifying unit 105A calculates 1.088435374 as the value of $i \cdot f_{in}/f_{out}$.

Next, the data specifying unit 105A calculates the rounddown $(i \cdot f_{in}/f_{out})$ and the roundup $(i \cdot f_{in}/f_{out})$ (step 004). When $i \cdot f_{in}/f_{out} = 1.088435374$, the data specifying unit 105A calculates each of "the rounddown $(i \cdot f_{in}/f_{out}) = 1$" and "the roundup $(i \cdot f_{in}/f_{out}) = 2$."

Next, the determining unit 105B determines whether the product $(i \cdot f_{in}/f_{out})$ is a natural number (step 005). When it is assumed that $i \cdot f_{in}/f_{out} = 1.088435374$, NO is determined in step 005. Then, the determining unit 105B determines whether there are both the first (rounddown (i·$f_{in}/f_{out}$)=1) input sampling data X1 and the second (roundup (i·$f_{in}/f_{out}$)= 2) input sampling data X2 in the input sampling data information stored in the storage 104 (step 006). When it is supposed that the input sampling data information stored in the storage 104 is information illustrated in FIG. 2, the determining unit 105B determines that there are both the input sampling data X1 and X2 (YES in step 006) and the data specifying unit 105A specifies "X1=0.5" and "X2=0.866025404" (step 007).

Next, the output data value calculator 105C applies the data values of the input sampling data X1 and X2 specified by the data specifying unit 105A, the value of the product (i·$f_{in}/f_{out}$) and the values of the rounddown (i·$f_{in}/f_{out}$) and the roundup (i·$f_{in}/f_{out}$) to the above-described calculation expression (Expression (1)), calculates the value of the $i^{th}$ output sampling data Yi of the output digital signal, and outputs the calculated value to the output signal transmitter 106 (step 008). In the example, since i=1, the first output sampling data Y1 calculated by the output data value calculator 105C is "{0.5×(2−1.088435374)+0.866025404×(1.088435374−1)}=0.53237." Next, the sampling frequency conversion processing unit 105 increments the counter value of the counter 105D (step 009), returns to the process of step 001, and sequentially calculates the output sampling data Yi by repeating the series of processes.

Thus, the sampling frequency conversion processing unit 105 sequentially calculates the output sampling data Yi for the L channel and the R channel at the output sampling frequency using the calculation expression (Expression (1)) of the above-described output sampling data Yi, and sequentially supplies the output sampling data Yi to the output signal transmitter 106.

Further, the sampling frequency conversion processing unit 105 preferably generates the output sampling data Yi at a processing speed at which one piece of data is calculated at one period of the RL clock $RL_{out}$ or a speed slightly faster than the processing speed.

The output signal transmitter 106 stores the output sampling data Yi supplied from the sampling frequency conversion processing unit 105 in the FIFO memory and sequentially outputs the output sampling data Yi in synchronization with the RL clock $RL_{out}$ of the output signal supplied from the clock generating circuit 108.

As described above, by configuring the asynchronous sampling frequency conversion device 1 according to this embodiment, it is possible to easily specify the input sampling data Xn and Xn+1 sampled immediately before and after the sampling timing of the output sampling data Yi based on the product (i·$f_{in}/f_{out}$) of the counter value i of the counter 105D and the ratio $f_{in}/f_{out}$ stored in the internal memory of the sampling frequency conversion processing unit 105. Further, as understood from the calculation expression (Expression (1)) of the output sampling data Yi according to this embodiment, the output sampling data Yi can be calculated by calculating the product (i·$f_{in}/f_{out}$) of the counter value i of the counter 105D and the ratio $f_{in}/f_{out}$, rounding down and rounding up the fraction of the calculated product to calculate natural numbers n and n+1, specifying the input sampling data Xn and Xn+1 based on the calculated natural numbers n and n+1, and using the data values. Accordingly, the calculation amount necessary to calculate the output sampling data Yi can be reduced compared to the conventional linear interpolation method of specifying "n" indicating the sampling sequence of the input sampling data Xn sampled immediately before the sampling timing of the output sampling data Yi and calculating each interpolation coefficient ki using the "n." Thus, the conversion process in the asynchronous sampling frequency conversion device 1 can be performed at high speed.

The LPF 102 may operate at the input sampling frequency $f_{in}$ of the input digital signal $S_{in}$ and may operate at a relatively low frequency.

The input sampling data Xn is once stored in the storage 104. Therefore, even when jitter is included in data to be input, the jitter can be absorbed.

Second Embodiment

Figure 7:
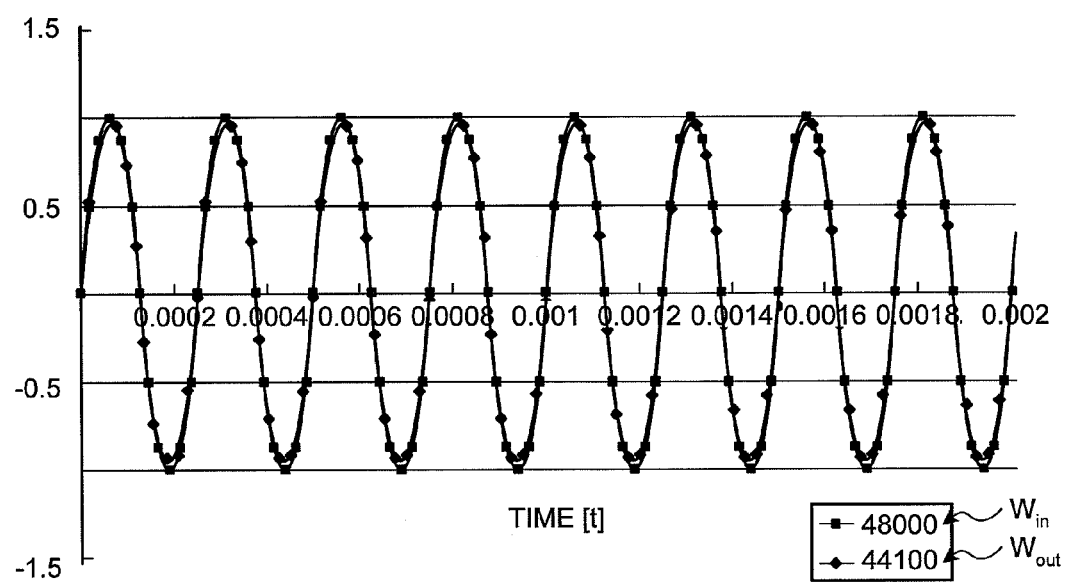
FIG. 7 is a diagram illustrating a waveform reproduced from the output sampling data illustrated in FIG. 6 and a waveform reproduced from input sampling data of the L channel.

In the first embodiment, the output data value calculator 105C of the sampling frequency conversion processing unit 105 has calculated the output sampling data Yi by the above-described calculation expression (Expression (1)). FIG. 6 is a diagram illustrating output sampling data Yi of an L channel at the output sampling frequency of 44.1 kHz calculated by the output data value calculator 105C according to the first embodiment. FIG. 7 is a diagram illustrating a waveform $W_{out}$ reproduced from the output sampling data Yi illustrated in FIG. 6, that is, the output sampling data Yi of the L channel at the output sampling frequency of 44.1 kHz calculated by the output data value calculator 105C and a waveform $W_{in}$ reproduced from the input sampling data Xn of the L channel at the input sampling frequency of 48 kHz according to the first embodiment.

When the waveform $W_{out}$ and the waveform $W_{in}$ are compared to each other with reference to FIG. 7, the amplitude of the waveform $W_{out}$ is reduced more than that of the waveform $W_{in}$. The reduction in the amplitude of the waveform $W_{out}$ is caused due to the frequency characteristics of the linear interpolation, as described in Background. Accordingly, in this embodiment, a waveform close to the waveform $W_{in}$ is configured to be reproduced from the output sampling data by using the output sampling data Yi calculated in the first embodiment as a reference value and correcting the reference value Yi using a change amount |Xn−Xn+1| between the input sampling data Xn and Xn+1. Thus, it is possible to remove a waveform distortion caused due to a decrease in the amplitude originated from the frequency characteristics of the linear interpolation.

Figure 8:
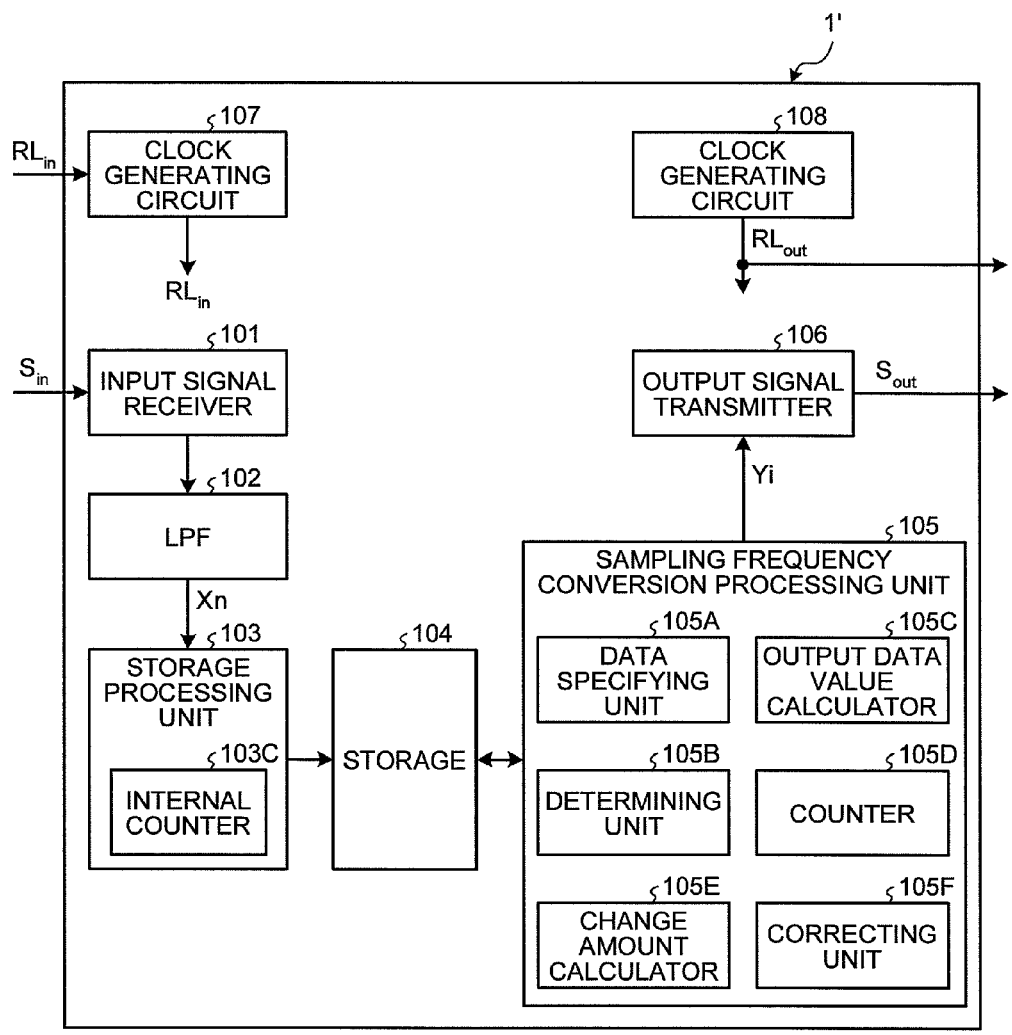
FIG. 8 is a block diagram illustrating an example of an asynchronous sampling frequency conversion device according to a second embodiment.

As illustrated in FIG. 8, an asynchronous sampling frequency conversion device 1' according to this embodiment is basically the same configuration as the asynchronous sampling frequency conversion device of the first embodiment, since the asynchronous sampling frequency conversion device 1' includes an input signal receiver 101, an LPF 102, a storage processing unit 103, a storage 104, a sampling frequency conversion processing unit 105, and an output signal transmitter 106. However, the sampling frequency conversion processing unit 105 further includes a change amount calculator 105E and a correcting unit 105F. Further, the internal memory of the sampling frequency conversion processing unit 105 stores a correction coefficient α included in a calculation expression for output sampling data Zi to be described below according to this embodiment. The correction coefficient α is a value experimentally calculated in advance. For example, the correction coefficient α is determined by calculating a decrease ratio of the amplitude caused due to the frequency characteristics of the linear interpolation in a frequency band of an input signal. Further, the correction coefficient α is preferably determined so that a waveform clip does not occur.

The change amount calculator 105E calculates a change amount |Xn−Xn+1| between the input sampling data Xn and Xn+1 specified by the data specifying unit 105A.

The correcting unit 105F uses the output sampling data Yi calculated by the output data value calculator 105C as a reference value and corrects the reference value Yi based on the change amount |Xn−Xn+1| calculated by the change amount calculator 105E. More specifically, the correcting unit 105F corrects the reference value Yi by the following calculation expression and calculates the corrected value as the output sampling data Zi.

$$Zi = Yi(1 + \alpha \cdot |Xn - Xn+1|) \qquad (2)$$

The sampling frequency conversion processing unit 105 outputs the value Zi corrected by the correcting unit 105F as an $i^{th}$ output sampling data to the output signal transmitter 106.

Figure 10:
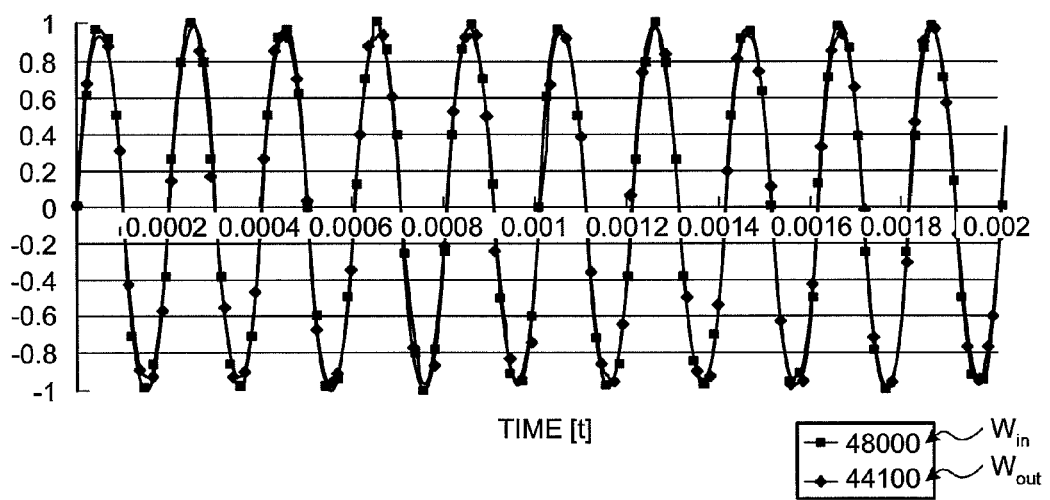
FIG. 10 is a diagram illustrating a waveform reproduced from the output sampling data illustrated in FIG. 9 and a waveform reproduced from input sampling data of the L channel.

FIG. 9 is a diagram illustrating a list of the output sampling data Zi calculated by performing the conversion process on a sine wave sin (2π·8000·t) with 8 kHz at the input sampling frequency of 48 kHz and the output sampling frequency of 44.1 kHz, when the correction coefficient α is set to 0.2. FIG. 10 is a diagram illustrating a waveform $WZ_{out}$ reproduced from the output sampling data Zi illustrated in FIG. 9, that is, the output sampling data Zi of the L channel at the output sampling frequency of 44.1 kHz calculated by the correcting unit 105F and a waveform $W_{in}$ reproduced from the input sampling data Xn of the L channel at the input sampling frequency of 48 kHz.

When the waveform $WZ_{out}$ is compared to the waveform $W_{in}$ with reference to FIG. 10, it can be understood that the waveform $WZ_{out}$ is closer to the waveform $W_{in}$, compared to FIG. 7 illustrating the waveform $W_{out}$ and the waveform $W_{in}$ reproduced from the output sampling data Yi calculated in the first embodiment. This can be also understood from the output sampling data Yi and Zi indicated in FIGS. 6 and 9, respectively. For example, when Y3 in FIG. 6 is compared to Z3 in FIG. 9, the decrease in the amplitude originated from the frequency characteristics of the linear interpolation is improved so that the amplitude of Z3 is closer to the amplitude "1" of the sine wave sin (2π·8000·t) with 8 kHz since Y3=0.964456 and Z3=0.990298.

According to the method of calculating the output sampling data Zi using the change amount |Xn−Xn+1| between the input sampling data Xn and Xn+1, as described in this embodiment, the decrease ratio of the amplitude originated from the frequency characteristics of the linear interpolation increases, as the frequency of an input signal increases. Therefore, since the waveform distortion is accordingly noticeable, a high effect can be obtained.

In the above-described first and second embodiments, the cases have been described in which the input sampling frequency $f_{in}$ is 48 kHz and the output sampling frequency $f_{out}$ is 44.1 kHz, but the invention is not limited thereto. The input sampling frequency $f_{in}$ and the output sampling frequency $f_{out}$ are arbitrarily set including the magnitude relation therebetween. For example, the input sampling frequency $f_{in}$ may be set to 48 kHz and the output sampling frequency $f_{out}$ may be set to 32 kHz. Further, the input sampling frequency $f_{in}$ may be set to 44.1 kHz or 32 kHz and the output sampling frequency $f_{out}$ may be set to 48 kHz.

In the conversion process performed by the sampling frequency conversion processing unit 105, when the sampling frequency is lowered, the LPF 102 is necessary in order to set the input digital signal $S_{in}$ to be equal to or less than the nyquist frequency. However, when the sampling frequency is raised, the LPF 102 is not necessary.

The above-described first and second embodiments of the invention can be also applied to an asynchronous sampling frequency conversion device in which the input sampling frequency $f_{in}$ is varied. In this case, the sampling frequency conversion processing unit 105 may be configured to calculate the ratio $f_{in}/f_{out}$ of the input sampling frequency $f_{in}$ to the output sampling frequency $f_{out}$. Since the sampling frequency generally used in a digital device is limited, a ratio of a sampling frequency to the output sampling frequency $f_{out}$ may be retained in advance in the internal memory of the sampling frequency conversion processing unit 105.

In the above-described first and second embodiments, the cases have been described in which the internal memory of the sampling frequency conversion processing unit 105 stores the ratio $f_{in}/f_{out}$ of the input sampling frequency $f_{in}$ to the output sampling frequency $f_{out}$ in advance, but the invention is not limited thereto. The sampling frequency conversion processing unit 105 may calculate the ratio $f_{in}/f_{out}$.

The example has been described in which the storage processing unit 103 calculates the elapsed time Tn and stores the elapsed time Tn in the storage 104. However, the sampling frequency conversion processing unit 105 may calculates the elapsed time Tn.

In the above-described first embodiment, the storage 104 may be configured to beforehand retain output sampling information formed by a pair of "i" indicating the sampling sequence of the output sampling data Yi, a product $(i \cdot f_{in}/f_{out})$ of the ratio $f_{in}/f_{out}$ of the input sampling frequency $f_{in}$ to the output sampling frequency $f_{out}$ and "i" indicating the sampling sequence of the output sampling data Yi, and the value n of the rounddown $(i \cdot f_{in}/f_{out})$ as exemplified in FIG. 11. Thus, since the data specifying unit 105A can specify the value n of the rounddown $(i \cdot f_{in}/f_{out})$ from the counter value i of the counter 105D indicating the sampling sequence of the output sampling data Yi, the calculation time of the output sampling data can be further shortened. Therefore, the conversion process performed by the sampling frequency conversion processing unit 105 can be performed at higher speed.

In the above-described second embodiment, the case has been described in which the calculation expression (Expression (2)) of the output sampling data Zi is Zi=Yi·(1+α·|Xn−Xn+1|), but the invention is not limited thereto. The output sampling data Zi may be calculated by the calculation expression of "Zi=Yi·{(1+β·F(|Xn−Xn+1|)}" by using F(x) and β as a function and a correction coefficient, respectively.

In the above-described embodiments, the above-described processes may be performed by storing and distributing a program (a computer program product) to be executed in a computer-readable recording medium such as a flexible disk, a CD-ROM (Compact Disc Read-Only Memory), DVD, or an MO (Magneto-Optical Disc) and installing the program.

Further, a program may be stored in a disc device or the like included in a predetermined server apparatus on a communication network such as the Internet and may be acquired, for example, by superimposing the program on carrier waves.

In the above-described embodiments, it is possible to reduce a calculation amount and also perform a conversion process at high speed. Furthermore, it is possible to realize excellent reproducibility of a signal waveform.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An asynchronous sampling frequency conversion device comprising:
   a storage unit configured to store input digital signals;
   a data specifying unit configured to specify first data and second data based on a ratio of a sampling frequency of the input digital signal to a sampling frequency of an output digital signal, the first data being sampled at a sampling timing immediately before an $i^{th}$ (where i is a natural number) sampling timing of the output digital signal among the input digital signals stored in the storage unit, the second data being sampled at the sampling timing immediately after the $i^{th}$ sampling timing of the output digital signal; and
   an output data value calculator configured to calculate a value of $i^{th}$ data of the output digital signal based on the first data and the second data specified by the data specifying unit and the ratio,
   wherein the data specifying unit is configured to specify the first data that is rounddown value in accord with a sequence of the sampling timing, and to specify the second data that is roundup value in accord with the sequence of the sampling timing, the rounddown value being obtained by rounding down a multiplication value to a natural number, the roundup value being obtained by rounding up the multiplication value to a natural number, the multiplication value being obtained by multiplying the ratio and i indicating the sequence of the sampling timing of data to be calculated by the output data value calculator, and
   the output data value calculator is configured to calculate the value of the $i^{th}$ data of the output digital signal through linear interpolation using the first data and the second data specified by the data specifying unit, the multiplication value, the rounddown value, and the roundup value.

2. The asynchronous sampling frequency conversion device according to claim 1, further comprising:
   a storage processing unit configured to store the input digital signals in correspondence with sequences of the sampling timing and values of sequentially sampled data in the storage unit,
   wherein the data specifying unit is configured to search for the sequence of the sampling timing which corresponds to the sampled data stored in the storage unit, to specify, as the first data, data corresponding to the sequence of the sampling timing in accord with the rounddown value and to specify, as the second data, data corresponding to the sequence of the sampling timing in accord with the roundup value.

3. The asynchronous sampling frequency conversion device according to claim 1, further comprising:
   a determining unit configured to determines whether the multiplication value is a natural number,
   wherein, when the determining unit determines that the multiplication value is the natural number,
      the data specifying unit is configured to specify, as the first data and the second data, data sampled at the same timing as the $i^{th}$ sampling timing of the output digital signal among the input digital signals stored in the storage unit, and
      the output data value calculator is configured to calculate, as the value of the $i^{th}$ data of the output digital signal, a value of data sampled at the same timing as the $i^{th}$ sampling timing of the output digital signal specified by the data specifying unit.

4. The asynchronous sampling frequency conversion device according to claim 1, further comprising:
   a change amount calculator configured to calculate an absolute value of a change amount of the second data with respect to the first data; and
   a correcting unit configured to correct the value of the $i^{th}$ data of the output digital signal calculated by the output data value calculator based on the absolute value of the change amount of the second data with respect to the first data, which is calculated by the change amount calculator.

5. An asynchronous sampling frequency conversion method comprising:
   storing input digital signals in a storage unit;
   specifying first data and second data based on a ratio of a sampling frequency of the input digital signal to a sampling frequency of an output digital signal, the first data being sampled at a sampling timing immediately before an $i^{th}$ (where i is a natural number) sampling timing of the output digital signal among the input digital signals stored in the storage unit, the second data being sampled at the sampling timing immediately after the $i^{th}$ sampling timing of the output digital signal; and
   calculating a value of $i^{th}$ data of the output digital signal based on the specified first data, the specified second data and the ratio,
   wherein the specifying of the first data and the second data includes specifying the first data that is rounddown value in accord with a sequence of the sampling timing, and specifying the second data that is roundup value in accord with the sequence of the sampling timing, the rounddown value being obtained by rounding down a multiplication value to a natural number, the roundup value being obtained by rounding up the multiplication value to a natural number, the multiplication value being obtained by multiplying the ratio and i indicating the sequence of the sampling timing of data to be calculated by the output data value calculator, and
   the calculating includes calculating the value of the $i^{th}$ data of the output digital signal through linear interpolation using the first data and the second data specified by the step of specifying, the multiplication value, the rounddown value, and the roundup value.

6. A computer program product comprising a non-transitory computer usable medium having computer readable program codes embodied in the medium causing a computer to execute:
   storing input digital signals in a storage unit;
   specifying first data and second data based on a ratio of a sampling frequency of the input digital signal to a sampling frequency of an output digital signal, the first data being sampled at a sampling timing immediately before an $i^{th}$ (where i is a natural number) sampling timing of the output digital signal among the input digital signals stored in the storage unit, the second data being sampled at the sampling timing immediately after the $i^{th}$ sampling timing of the output digital signal; and
   calculating a value of $i^{th}$ data of the output digital signal based on the specified first data, the specified second data and the ratio,
   wherein the specifying of the first data and the second data includes specifying the first data that is rounddown value in accord with a sequence of the sampling timing, and specifying the second data that is roundup value in accord with the sequence of the sampling timing, the rounddown value being obtained by rounding down a multiplication value to a natural number, the roundup value being obtained by rounding up the multiplication value to a natural number, the multiplication value being obtained by multiplying the ratio and i indicating the sequence of the sampling timing of data to be calculated by the output data value calculator, and the calculating includes calculating the value of the $i^{th}$ data of the output digital signal through linear interpolation using the first data and the second data specified by the step of specifying, the multiplication value, the round-down value, and the roundup value.

* * * * *